United States Patent
Zhang et al.

(10) Patent No.: US 11,594,856 B2
(45) Date of Patent: Feb. 28, 2023

(54) WAVELENGTH DRIFT SUPPRESSION FOR BURST-MODE TUNABLE EML TRANSMITTER

(71) Applicant: Google LLC, Mountain View, CA (US)

(72) Inventors: Tao Zhang, Mountain View, CA (US); Cedric Fung Lam, San Carlos, CA (US); Shuang Yin, Sunnyvale, CA (US); Xiangjun Zhao, Fremont, CA (US); Liang Du, Santa Clara, CA (US); Changhong Joy Jiang, Dublin, CA (US); Adam Edwin Taylor Barratt, Portland, OR (US); Claudio Desanti, ountain View, CA (US); Muthu Nagarajan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 88 days.

(21) Appl. No.: 17/057,652

(22) PCT Filed: May 7, 2019

(86) PCT No.: PCT/US2019/031125
§ 371 (c)(1),
(2) Date: Nov. 21, 2020

(87) PCT Pub. No.: WO2019/226337
PCT Pub. Date: Nov. 28, 2019

(65) Prior Publication Data
US 2021/0203130 A1     Jul. 1, 2021

Related U.S. Application Data

(60) Provisional application No. 62/674,434, filed on May 21, 2018.

(51) Int. Cl.
*H01S 5/042*     (2006.01)
*H01S 5/0625*     (2006.01)
(Continued)

(52) U.S. Cl.
CPC .......... *H01S 5/0428* (2013.01); *H01S 5/0427* (2013.01); *H01S 5/068* (2013.01);
(Continued)

(58) Field of Classification Search
None
See application file for complete search history.

(56) References Cited

U.S. PATENT DOCUMENTS

| 4,539,686 A | * | 9/1985 | Bosch | .................. H01S 5/06213 |
| | | | | 372/38.02 |
| 5,014,280 A | * | 5/1991 | Sanada | .................. H01S 5/0625 |
| | | | | 372/50.1 |

(Continued)

FOREIGN PATENT DOCUMENTS

| EP | 3048680 A1 | 7/2016 |
| JP | H10256676 A | 9/1998 |

OTHER PUBLICATIONS

International Search Report and Written Opinion for the related Application No. PCT/US2019/031125, dated Sep. 19, 2019.

*Primary Examiner* — Tod T Van Roy
(74) *Attorney, Agent, or Firm* — Honigman LLP; Brett A. Krueger

(57) ABSTRACT

A method (900) includes delivering a first bias current ($I_{GAIN}$) to an anode of gain-section diode (590a) and delivering a second bias current ($I_{PH}$) to an anode of a phase-section diode (590b). The method also includes receiving a burst mode signal (514) indicative of a burst-on state or a burst-on state, and sinking a first sink current ($I_{SINK}$) away from the first bias current when the burst mode signal is indicative of the burst-off state. When the burst mode signal transitions to be indicative of the burst-on state from the burst-off state, the method also includes sinking a second sink current away from the second bias current at the anode (Continued)

of the phase-section diode and ceasing the sinking of the first sink current away from the first bias current at the anode of the gain section diode.

24 Claims, 13 Drawing Sheets

(51) Int. Cl.
*H01S 5/068* (2006.01)
*H01S 5/323* (2006.01)
*H04J 4/00* (2006.01)

(52) U.S. Cl.
CPC ........ *H01S 5/0625* (2013.01); *H01S 5/32391* (2013.01); *H04J 4/00* (2013.01)

(56) References Cited

U.S. PATENT DOCUMENTS

| | | | | |
|---|---|---|---|---|
| 5,088,097 A * | 2/1992 | Ono | .................... | H01S 3/1055 372/20 |
| 5,513,197 A * | 4/1996 | Koishi | .................... | H01S 5/042 372/38.07 |
| 5,706,117 A * | 1/1998 | Imai | .................... | G02F 1/0123 372/29.02 |
| 6,044,097 A * | 3/2000 | Kawamura | .................... | H01S 5/0427 372/38.01 |
| 6,738,398 B2 * | 5/2004 | Hirata | .................... | H01S 5/06256 372/29.014 |
| 7,031,358 B2 * | 4/2006 | Nakayama | .................... | H01S 5/042 372/38.1 |
| 7,085,297 B2 * | 8/2006 | Senga | .................... | H01S 5/06256 372/38.1 |
| 7,400,659 B2 * | 7/2008 | Hu | .................... | H01S 5/06256 348/E9.026 |
| 8,121,161 B2 * | 2/2012 | Tanaka | .................... | H01S 5/06213 372/38.07 |
| 8,705,979 B2 * | 4/2014 | Fujita | .................... | H01S 5/0428 398/189 |
| 8,737,442 B2 * | 5/2014 | Moto | .................... | H01S 5/0428 372/38.07 |
| 9,088,122 B2 * | 7/2015 | Moto | .................... | H01S 5/0085 |
| 9,667,031 B2 * | 5/2017 | Ritter | .................... | H05B 45/375 |
| 10,103,513 B1 * | 10/2018 | Zhang | .................... | H01S 5/068 |
| 10,153,612 B1 * | 12/2018 | Zhang | .................... | H01S 5/125 |
| 10,454,243 B2 * | 10/2019 | Bai | .................... | H01S 5/06808 |
| 10,461,498 B2 * | 10/2019 | Zhang | .................... | H01S 5/06256 |
| 10,587,092 B2 * | 3/2020 | Ono | .................... | H01S 5/0428 |
| 10,666,013 B2 * | 5/2020 | Tanaka | .................... | H01S 5/0427 |
| 10,680,406 B2 * | 6/2020 | Ono | .................... | H01S 5/1017 |
| 11,329,450 B2 * | 5/2022 | Nakamura | .................... | H01S 5/34326 |
| 11,329,451 B2 * | 5/2022 | Pannwitz | .................... | G01S 17/931 |
| 2001/0005388 A1 * | 6/2001 | Hirata | .................... | H01S 5/06256 372/22 |
| 2002/0006141 A1 * | 1/2002 | Ogura | .................... | H01S 5/06255 372/18 |
| 2002/0064353 A1 * | 5/2002 | Yokoyama | .................... | G02B 6/4215 385/88 |
| 2002/0075919 A1 * | 6/2002 | Tochio | .................... | H01S 5/042 372/38.02 |
| 2003/0057456 A1 * | 3/2003 | Wada | .................... | H01S 5/04256 257/222 |
| 2003/0174744 A1 * | 9/2003 | Reilly | .................... | H01S 5/0683 372/32 |
| 2003/0185257 A1 * | 10/2003 | Suzuki | .................... | H01S 5/042 372/50.1 |
| 2004/0109482 A1 * | 6/2004 | Nakayama | .................... | H01S 5/042 372/38.02 |
| 2007/0127534 A1 * | 6/2007 | Shimamura | .................... | H01S 5/0265 372/46.015 |
| 2013/0016745 A1 * | 1/2013 | Moto | .................... | H01S 5/0428 372/29.011 |
| 2014/0341593 A1 * | 11/2014 | van Veen | .................... | H04B 10/272 398/201 |
| 2016/0013614 A1 * | 1/2016 | Moto | .................... | H01S 5/0427 372/38.02 |
| 2016/0141833 A1 * | 5/2016 | Moto | .................... | H01S 5/0428 372/38.02 |
| 2017/0222726 A1 * | 8/2017 | Kubo | .................... | H04B 10/504 |
| 2017/0237232 A1 * | 8/2017 | Asaka | .................... | H04B 10/25137 372/38.02 |
| 2019/0036302 A1 * | 1/2019 | Zhang | .................... | H01S 5/0428 |
| 2019/0173262 A1 * | 6/2019 | Ono | .................... | H01S 5/0206 |
| 2019/0181608 A1 * | 6/2019 | Ono | .................... | H01S 5/0265 |
| 2020/0076159 A1 * | 3/2020 | Choi | .................... | H01S 5/06255 |
| 2020/0321748 A1 * | 10/2020 | Pannwitz | .................... | G01S 17/931 |
| 2021/0151952 A1 * | 5/2021 | Zhang | .................... | H01S 5/06255 |
| 2021/0167577 A1 * | 6/2021 | Zhang | .................... | H01S 5/02415 |
| 2021/0184426 A1 * | 6/2021 | Koyama | .................... | H01S 5/0427 |
| 2021/0203129 A1 * | 7/2021 | Zhang | .................... | H04Q 11/00 |
| 2021/0203130 A1 * | 7/2021 | Zhang | .................... | H01S 5/0625 |

\* cited by examiner

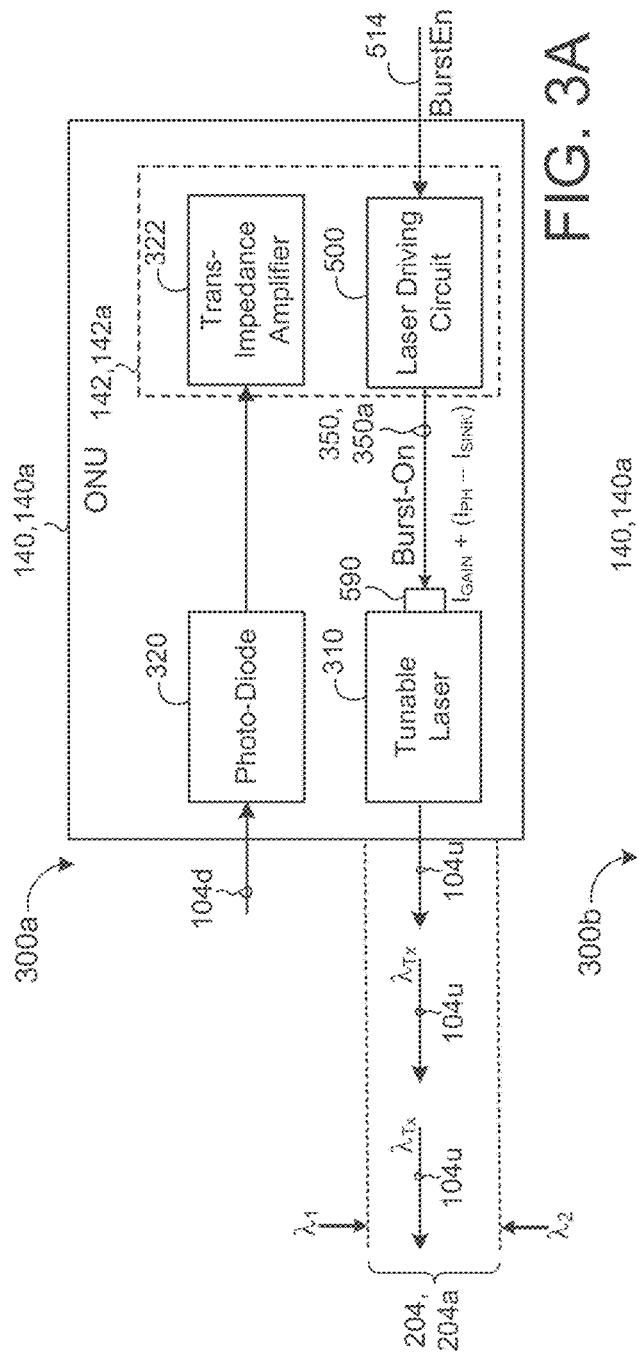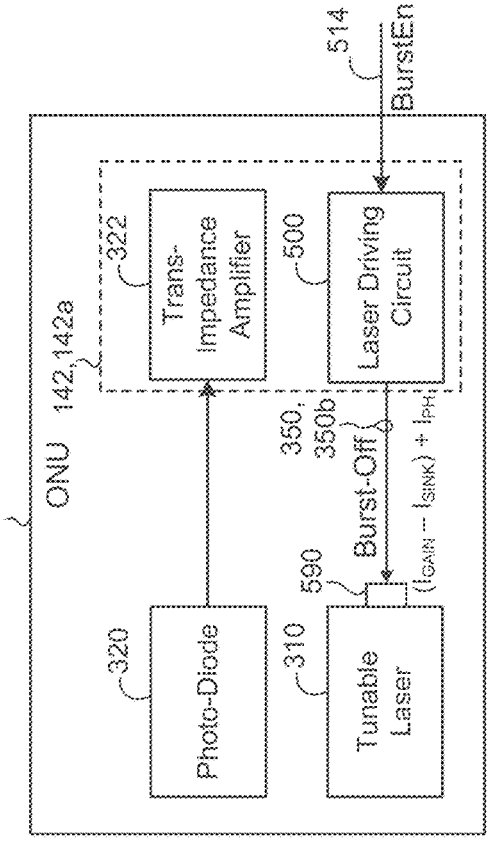

WAVELENGTH DRIFT SUPPRESSION FOR BURST-MODE TUNABLE EML TRANSMITTER

TECHNICAL FIELD

This disclosure relates to wavelength drift suppression for burst-mode tunable EML transmitters.

BACKGROUND

The tunable optical network unit (ONU) is a component widely used in a Time and Wavelength Division Multiplexing-Passive Optical Network (TWDM-PON) system, which serves as the primary architecture for Next-Generation Passive Optical Networks (NG-PON1 and NG-PON2). A tunable transmitter, which is made of a laser and a driving circuit for the laser, is the most critical component in the tunable ONU. Traditionally, Directly Modulated Lasers (DMLs) have been widely used in the TWDM-PON system with wavelength lengths tuned either through Distributed Bragg Reflector (DBR) current or the temperature by Thermoelectric Cooling (TEC) control. However, DML-based tunable ONUs suffer from limited transmission distance because of dispersion. Instead, an Electro-absorption Modulated Laser (EML)-based tunable ONU is preferable because of its superior performance and compact size. Typically, a burst-mode circuit drives an EML. Wavelength stability is a crucial specification for a tunable ONU and the associated burst-mode circuit, as wavelength drift may cause channel cross-talk. Temperature can have a significant impact on the wavelength of the laser. Despite the TEC controlling the temperature accurately at static states, the self-heating effects, introduced by burst-operations, can cause large wavelength drifts, which eventually introduces large Bit-Error-Rate (BER) for the optical system. Moreover, a fast burst time is required to reduce the overhead and increase the bandwidth of the system.

SUMMARY

One aspect of the disclosure provides a method of biasing a tunable laser during burst-on and burst-off states that includes delivering, by a laser driving circuit, a first bias current to an anode of a gain-section diode disposed on a shared substrate of a tunable laser, delivering, by the laser driving circuit, a second bias current to an anode of a phase-section diode disposed on the shared substrate of the tunable laser, and receiving, at the laser driving circuit, a burst mode signal indicative of a burst-on state or a burst-off state. When the burst mode signal is indicative of the burst-off state, the method also includes sinking, by the laser driving circuit, a first sink current away from the first bias current at the anode of the gain-section diode. The first sink current is less than the first bias current delivered to the anode of the gain-section diode. When the burst mode signal transitions to be indicative of the burst-on state from the burst-off state, the method also includes: sinking, by the laser driving circuit, a second sink current away from the second bias current at the anode of the phase-section diode, the second sink current less than the second bias current delivered to the anode of the phase-section diode; and ceasing, by the laser driving circuit, the sinking of the first sink current away from the first bias current at the anode of the gain-section diode.

Implementations of the disclosure may include one or more of the following optional features. In some implementations, the gain-section diode receives a gain-section diode current equal to the first bias current minus the first sink current when the burst mode signal is indicative of the burst-off state, while the phase-section diode receives a phase-section diode current equal to the second bias current minus the second sink current when the burst mode signal is indicative of the burst-on state. In some examples, the anode of the phase-section diode is connected to a current source through an inductor. In other examples, the anode of the phase-section diode is connected to an inductor through a resistor, wherein the inductor is connected to a voltage source.

In some examples, the method also includes receiving, at the laser driving circuit, a sink current adjustment from a sinking stage of the laser driving circuit. Here, the sink current adjustment is configured to adjust the first sink current and the second sink current. The sinking stage may include a differential pair of first and second metal-oxide-semiconductor field-effect transistors (MOSFETs), each MOSFET connected to a burst mode signal source, the first MOSFET connected to the anode of the phase-section diode, the second MOSFET connected to the anode of the gain-section diode. Optionally, the first MOSFET may be turned off and the second MOSFET may be turned on to sink the first sink current away from the anode of the gain-section diode when the burst mode signal is indicative of the burst-off state. On the other hand, the first MOSFET may be optionally turned on and the second MOSFET may be turned off to sink the second sink current away from the anode of the phase-section diode when the burst mode signal is indicative of the burst-on state In some implementations, the method further includes modulating, by the laser driving circuit, the laser by a capacitively coupled modulation stage of the laser driving circuit to an anode of an Electro-Absorption-section diode, resulting in an alternating current (AC) modulation current. The modulation stage may include a differential pair of first and second metal-oxide-semiconductor field-effect transistors (MOSFETs), the first MOSFET connected to a positive data signal source and to a first resistor, the first resistor connected to a voltage source, the second MOSFET connected to a negative data signal source, to a second resistor, and to a capacitor, the second resistor connected to the voltage source, and the capacitor connected to the anode of the Electro-Absorption-section diode. Optionally, the capacitor may be connected to an inductor connected to a variable voltage source. Further, the tunable laser may include an electro-absorption tunable laser.

Another aspect of the disclosure provides a laser driving circuit that includes a first current source configured to deliver a first bias current to an anode of a gain-section diode disposed on a shared substrate of a tunable laser, a second current source configured to deliver a second bias current to an anode of a phase-section diode disposed on the shared substrate of the tunable laser, and a sinking stage configured to receive a burst mode signal indicative of a burst-on state or a burst-off state. The sinking stage is configured to, sink a first sink current away from the first bias current at the anode of the gain-section diode when the burst mode signal is indicative of the burst-off state. The first sink current less than the first bias current received by the anode of the gain-section diode. When the burst mode signal transitions to be indicative of the burst-on state from the burst-off state, the sinking stage is configured to: sink a second sink current away from the second bias current at the anode of the phase-section diode, the second sink current less than the second bias current received by the anode of the phase-section diode; and cease the sinking of the first sink current away from the first bias current at the anode of the gain-section diode.

This aspect may include one or more of the following optional features. In some implementations, the gain-section diode receives a gain-section diode current equal to the first bias current minus the first sink current when the burst mode signal is indicative of the burst-off state, while the phase-section diode receives a phase-section diode current equal to the second bias current minus the second sink current when the burst mode signal is indicative of the burst-on state. In some examples, the anode of the phase-section diode is connected to a current source through an inductor. In other examples, the anode of the phase-section diode is connected to an inductor through a resistor, wherein the inductor is connected to a voltage source.

In some examples, the laser driving circuit further includes a third current source configured to adjust the first sink current and the second sink current. The sinking stage may include a differential pair of first and second metal-oxide-semiconductor field-effect transistors (MOSFETs), each MOSFET connected to a burst mode signal source, the first MOSFET connected to the anode of the phase-section diode, the second MOSFET connected to the anode of the gain-section diode. Optionally, the first MOSFET may be turned off and the second MOSFET may be turned on to sink the first sink current away from the anode of the gain-section diode when the burst mode signal is indicative of the burst-off state. On the other hand, the first MOSFET may be optionally turned on and the second MOSFET may be turned off to sink the second sink current away from the anode of the phase-section diode when the burst mode signal is indicative of the burst-on state.

In some implementations, the laser driving circuit further includes a modulating stage capacitively coupled to an anode of an Electro-Absorption-section diode, resulting in an alternating current (AC) modulation current. The modulation stage may include a differential pair of first and second metal-oxide-semiconductor field-effect transistors (MOSFETs), the first MOSFET connected to a positive data signal source and to a first resistor, the first resistor connected to a voltage source, the second MOSFET connected to a negative data signal source, to a second resistor, and to a capacitor, the second resistor connected to the voltage source, and the capacitor connected to the anode of the Electro-Absorption-section diode. Optionally, the capacitor may be connected to an inductor connected to a variable voltage source. Further, the tunable laser may include an electro-absorption tunable laser.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 3A and 3B are schematic views of an optical network unit configured to suppress wavelength drift when switching between operation in a burst-on state and a burst-off state.

Like reference symbols in the various drawings indicate like elements.

DETAILED DESCRIPTION

Implementations herein are directed toward an Electro-absorption Modulated Laser (EML) driving circuit configured to suppress wavelength drift caused by burst operation of EMLs used in tunable optical network units (ONUs).

Figure 1:
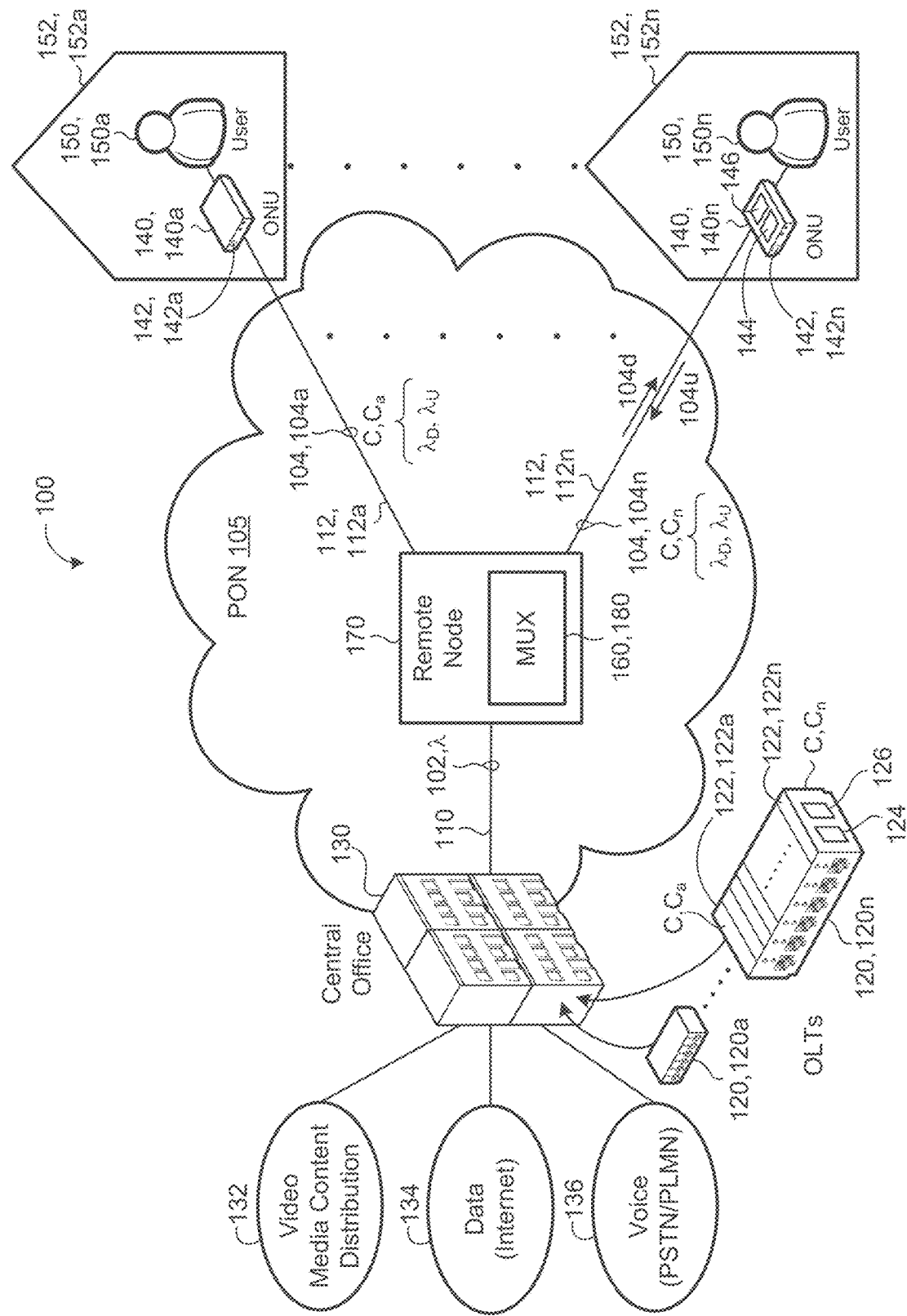
FIG. 1 is a schematic view of an example communication system.

Referring to FIG. 1, an optical communication system 100 delivers communication signals 102 (e.g., optical signals) through communication links 110, 112, 112*a-n* (e.g., optical fibers or line-of-sight free space optical communications) between an optical line terminal (OLT) 120 housed in a central office (CO) 130 and optical network units (ONUs) 140, 140*a-n* (e g., a bidirectional optical transceiver) associated with users 150, 150*a-n* (also referred to as customers or subscribers). The ONUs 140, 140*a-n* are typically located at premises 152, 152*a-n* of the users 150, 150*a-n*.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150*a-n* is terminated by a separate OLT 120*a-n*. In other examples, the optical communication system 100 implements a point-to-multi-point (pt-2-muiti-pt) PON, where a shared OLT 120 services multiple customers 150, 150*a-n*.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a band-multiplexer 160 configured to demultiplex the optical signal 102 and distribute demultiplexed optical signals 104 to multiple users 150, 150a-n along corresponding distribution fibers 112, 112a-n. The band-multiplexer 160 for multiplexing/demultiplexing may be an arrayed wavelength grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM and dense-WDM (DWDM), the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OUT 120 and a plurality of ONUs 140, 140a-n. For example, for downstream communications, the band-multiplexer 160 demultiplexes the optical signal 102 from the OLT 120 into ONU optical signals 104, 104a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

In some implementations, each ONU 140, 140a-n includes a corresponding tunable ONU transceiver 142, 142a-n (e.g., that includes a laser or light emitting diode) that can tune to any wavelength λ used by a corresponding OLT 120 at a receiving end. The ONU 140 may automatically tune the tunable ONU transceiver 142 to a wavelength λ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a laser driving circuit 500a-b (FIGS. 5A and 5B) configured to continuously provide a current to a tunable laser 310 in a burst-on state (FIG. 3A) and a burst-off state (FIG. 3B). The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television). Additional details on auto-tuning the ONU 140 to communicate with the corresponding OLT 120 can be found in U.S. patent application Ser. No. 15/354,811, filed on Nov. 17, 2016, which is hereby incorporated by reference in its entirety.

Figure 2:
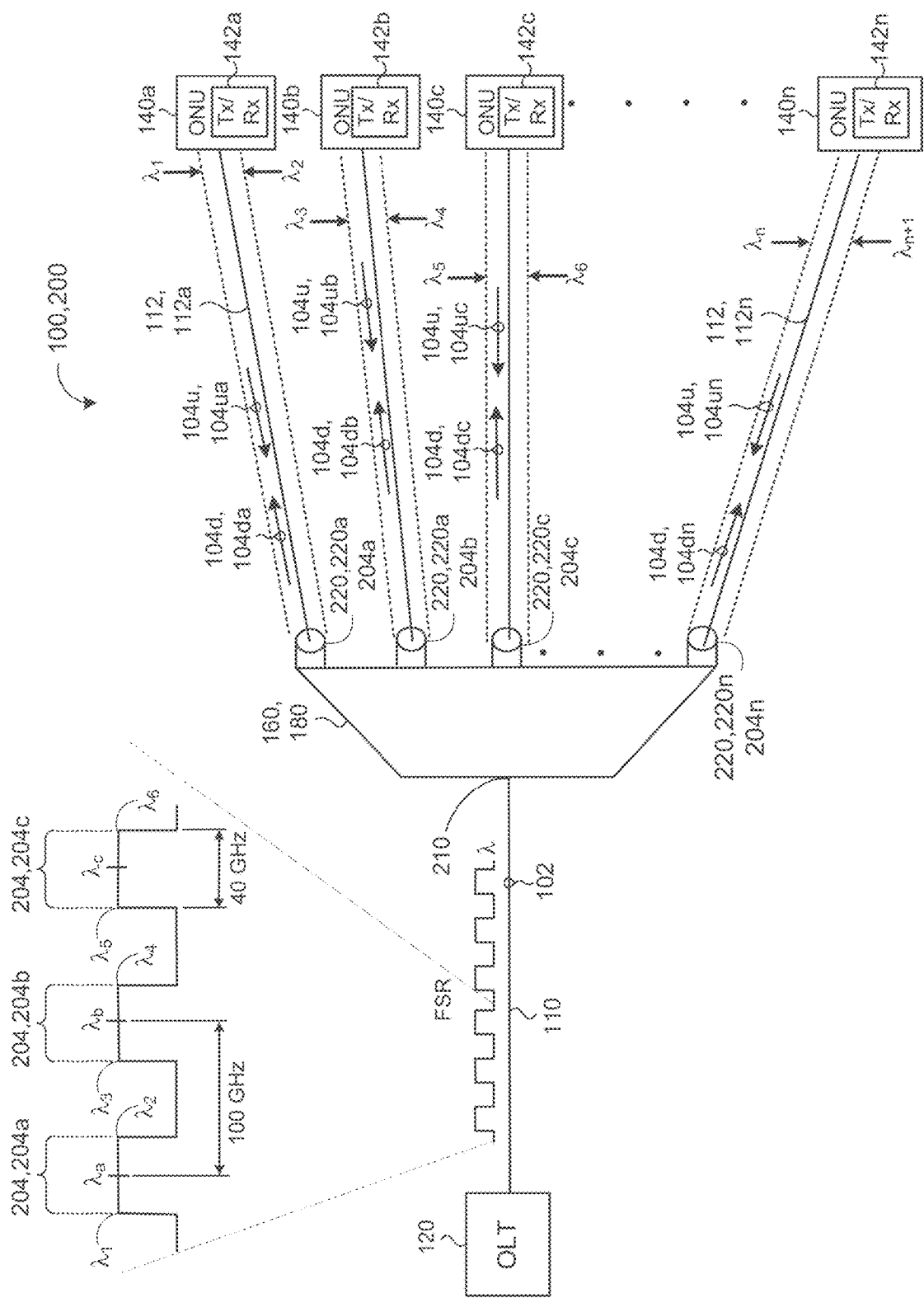
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n. An exemplary arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths λ for each corresponding ONU 140, 140a-n. The AWG 180 may reciprocally multiplex upstream ONU optical signals 104u, 104ua-104un of different wavelengths λ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ON Us 140, 140a-n. In some examples, the AWG 180 is disposed at the RN 170.

In other examples, the AWG 180 is disposed OLT 120, or more specifically, co-located with the OLT 120 at the CO 130.

The AWG 180 is cyclic in nature. The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths λ of the FSR are separated by about 100 Gigahertz (GHz) with a wavelength pass-hand 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz. However, in other configurations, the wavelength pass-band 204 may be greater than or equal to 40 GHz. The wavelength pass-band 204a associated with wavelength $\lambda_a$ is defined by lower and upper wavelength limits $\lambda_1$, $\lambda_2$, the wavelength pass-band 204b associated with wavelength $\lambda_b$ is defined by upper and lower wavelength limits $\lambda_3$, $\lambda_4$, and the wavelength pass-band 204c associated with wavelength $\lambda_c$ is defined by upper and lower wavelength limits $\lambda_5$, $\lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit as of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 340b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 310 (FIGS. 3A and 3B), usually a semiconductor laser such as an electro-absorption laser, configured to transmit upstream optical signals 104u to the OLT 120 in a burst-on state. Turning off the laser 310 to cease transmission of the optical signals 104u to the OLT 120 when not in use causes the temperature of the laser 310 to cool. The laser 310 is once again heated when turned on to transmit a subsequent upstream optical signal 104u. The thermal fluctuation caused by the repeated heating and cooling results in wavelength drift each time the laser 310 is turned on. In some examples, the wavelength of the optical signals 104u drift out of the wavelength pass-band 204 associated with the band-multiplexer 160, 180, thereby resulting in the band-multiplexer 160, 180 blocking the passage there through of the optical signals 104u to the OLT 120.

Referring to FIGS. 3A and 3B, in some implementations, the ONU transceiver 142, 142a of the ONU 140, 140a of the communication system 100 includes a laser driving circuit 500a or 500b for a tunable laser 310 configured to suppress wavelength drift when switching between operation in a burst-on state (FIG. 3A) and a burst-off state (FIG. 3B). Referring to FIG. 3A, the schematic view 300a shows the ONU 140 tuning the tunable laser 310 while in the burst-on state to transmit the optical signal 104u at the transmit wavelength $\lambda_{Tx}$ within the wavelength pass-band 204, 204a of the band-multiplexer 160 (e.g., AWG 180). The band-multiplexer 160 is configured to allow passage therethrough of the optical signal 104u at the transmit wavelength $\lambda_{Tx}$.

The band-multiplexer 160 may include the AWG 180 having the corresponding demultiplex port 220, 220a associated with the wavelength pass-band 204, 204a defined by the upper and lower wavelength limits $\lambda_1$, $\lambda_2$. The ONU transceiver 142 also includes a trans-impedance amplifier (TIA) 322 configured to receive downstream optical signals 104d through a photo-diode 320 from the OLT 120 that have been demultiplexed by the band-multiplexer 160. The data processing hardware (e.g., control hardware) 144, 144a of the ONU 140 implements an EML driving circuit 500a or 500b with alternating current (AC) coupling that electrically couples electrical signals to the tunable laser 310 to enable fast switching between the burst-on and burst-off states and minimize wavelength drifts. For instance, the laser driving circuit 500a-b may deliver a burst-on current 350, 350a to the tunable laser 310 to operate the laser 310 in the burst-on state and deliver a burst-off current 350, 350b to the tunable laser 310 to operate the tunable laser 310 in the burst-off state. In some configurations, the tunable laser 310 includes a multi-section structure with each section/structure sharing a single substrate. For example, the laser 310 may include a tunable electro-absorption modulated laser having a gain section, a phase section, an Electro-Absorption (EA) section, and a DBR section on a same substrate. Each section has a P-doped Indium phosphide (InP) region on a shared N-doped InP substrate which forms a corresponding diode 590 (gain-section diode 590a, phase-section diode 590b, EA-section diode 590c, and DBR-section diode 590d) with a common cathode. Corresponding injection currents ($I_{D0}$, $I_{D1}$, $I_{D2}$, and $I_{D3}$) drive these diodes. The laser 310 is not limited to EML lasers and may correspond to any multi-section tunable laser 310. The gain-section diode 590a is configured to receive a diode current $I_{D0}$ (FIGS. 5A and 5B) (e.g., injection current 350, 350a-b) for biasing the laser 310 to a wavelength determined and tuned by the current magnitudes ($I_{DBR}$, $I_{PHASE}$) at the DBR section and the phase section.

In some examples, the laser driving circuit 500a-b receives a burst mode signal (BurstEn) 514 indicative of the burst-on state to deliver the burst-on current 350a to the tunable laser 310 (i.e., the sum of diode currents $I_{D0}$ and $I_{D1}$ delivered to the anode of the gain-section diode 590a and the anode of the phase-section diode 590b, respectively). The burst-on current 350a may bias the tunable laser 310 to transmit the optical signal 104u at the transmit wavelength $\lambda_{Tx}$ within the wavelength pass-band 204 of the band-multiplexer 160. The burst-on current 350a corresponds to a gain bias current ($I_{GAIN}$), phase bias current ($I_{PH}$), and a sink current ($I_{SINK}$) sinking a portion of the $I_{PH}$ away from the anode of the phase-section diode 590a.

Referring to FIG. 3B, the schematic view 300b shows the ONU 140a tuning the tunable laser 310 in the burst-off state to cease transmission of the optical signal 104u to the OLT 120. While in the burst-off state, the laser 310 is not lasing or is only producing an optical power output of low magnitude insufficient for receipt by the receiver sensitivity at the OLT 120. In some implementations, the laser driving circuit 500a-b receives the burst mode signal (BurstEn) 514 indicative of the burst-off state to deliver the burst-off current 350b to the tunable laser 310. The burst-off current 350b may bias the tunable laser 310 to cease transmission of the optical signal 104u at the transmit wavelength $\lambda_{Tx}$ within the wavelength pass-band 204.

During the burst-off state, the laser driving circuit 500 delivers the burst-off current 350b to the tunable laser 310 to maintain the laser's 310 temperature during the burst-off state. Here, the burst-off current 350b (i.e., the sum of diode currents $I_{D0}$ and $I_{D1}$ delivered to the anode of the gain-section diode 590a and the anode of the phase-section diode 590b, respectively) corresponds to a gain bias current ($I_{GAIN}$), phase bias current ($I_{PH}$), and a sink current ($I_{SINK}$) sinking a portion of the $I_{GAIN}$ away from the anode of the gain-section diode 590a. Accordingly, the laser 310 is continuously heated by the burst-off current 350b (i.e., primarily $I_{PH}$) during the burst-off state. Thus, rather than un-powering the laser 310 entirely by sinking all of the bias current ($I_{GAIN}+I_{PH}$) or by grounding the anode of the gain-section diode 590a to zero to cease transmission of the optical signal 104u to the OLT 120, and thereby cause cooling of the laser 310, the gain-section diode 590a and phase-section diode 590b are configured to receive the burst-off current 350b to heat the tunable laser 310, while at the same time ceasing transmission of the optical signal 104u to the OLT 120. The continuous heating of the tunable laser 310 by the burst-off current 350b while in the burst-off state decreases thermal fluctuations at the laser 310, and thereby substantially inhibits large wavelength drifts from occurring when the ONU 140 is commanded to subsequently transmit data in the optical signal 104u for receipt by the OLT 120.

Figure 4A:
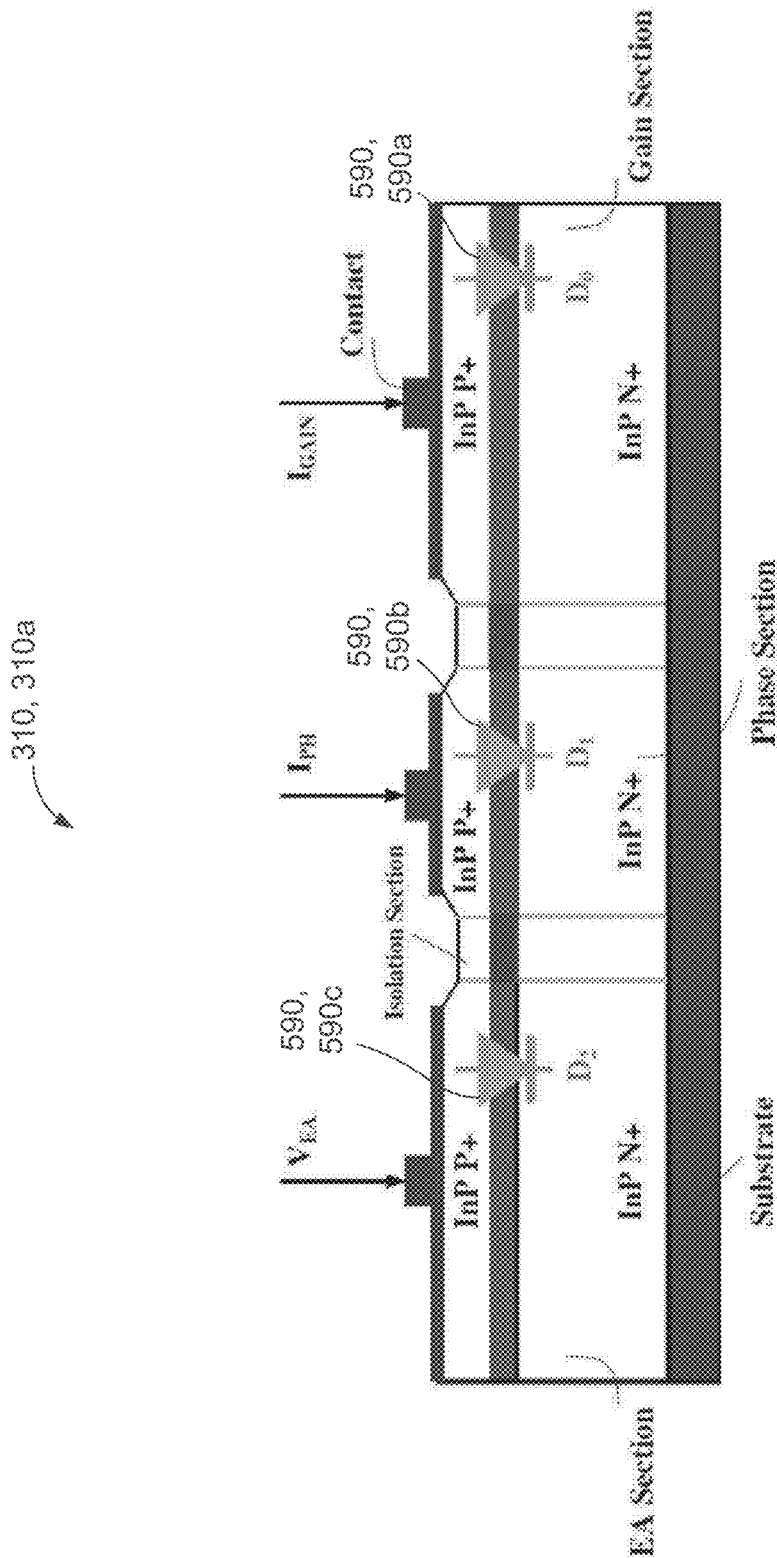
FIGS. 4A-4C are schematic views of example multi-section tunable lasers.

FIG. 4A provides an example EML 310a for use in burst mode operations in TWDM-PON applications. The laser 310a may include a multi-section structure having a gain section, a phase section, and an Electro-Absorption (EA) section. The Continuous-Wavelength (CW) light emits from the gain-section using the current $I_{GAIN}$. The EA section is reversely-biased by a negative voltage source $V_{EA}$ and works as an optical switch with the modulation voltage. The phase section suppresses the crosstalk between the gain and EA sections. The phase section may also fine-tune the wavelength with the current $I_{PH}$.

Figure 4B:
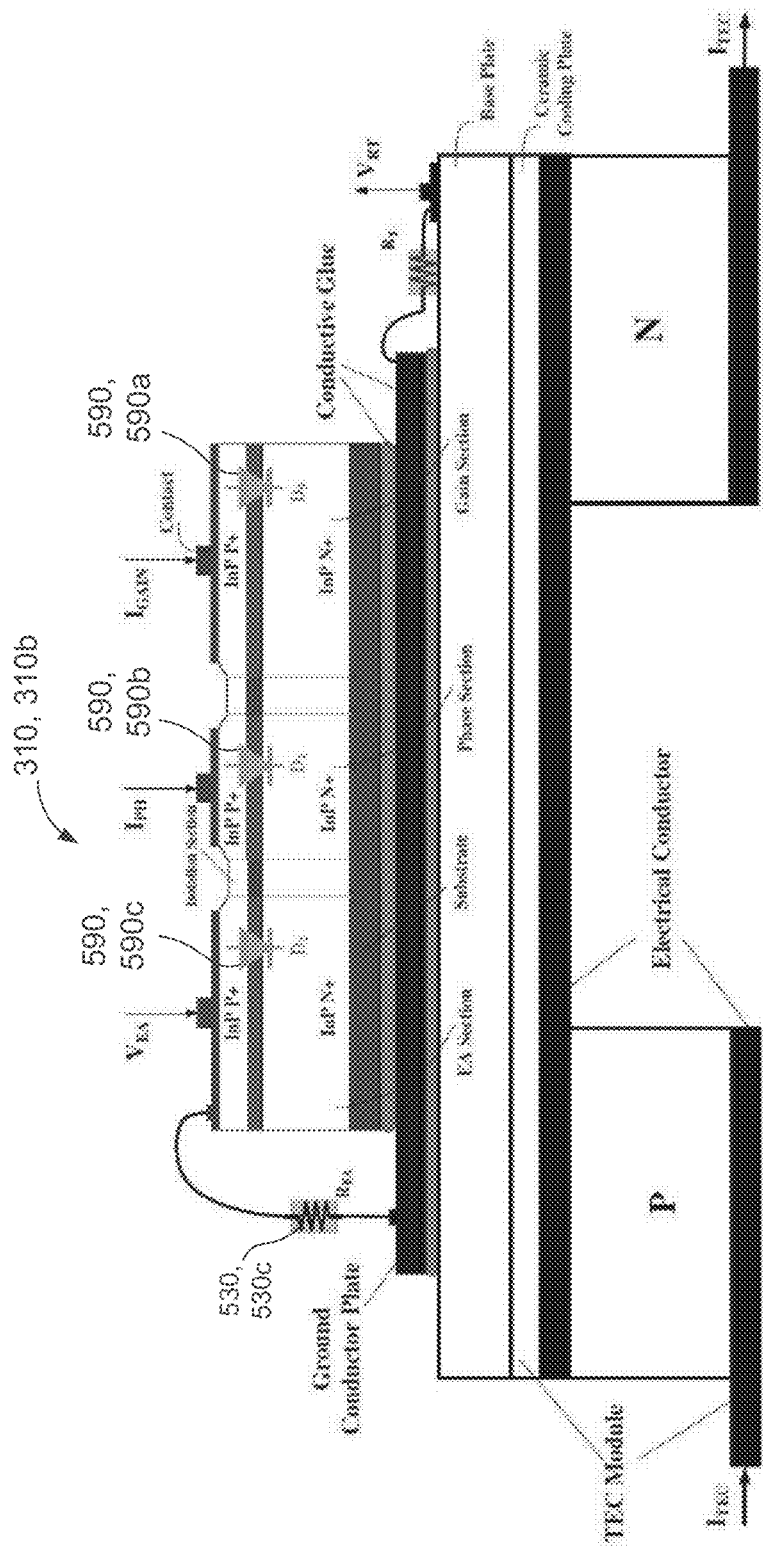

FIG. 4B provides an example EML laser 310b with a wavelength tuning mechanism for the simple EML 310b. A Thermoelectric Cooling (TEC) control module precisely controls the temperature of the laser 310b by cooling or warming the laser 310b. Because of the correlation between temperature and wavelength, this precise temperature control help tune the wavelength. A thermistor $R_T$, which behaves as a temperature sensor, may attach to the base plate of the EML chip via an adhesive (e.g., conductive glue). The sensed voltage $V_{RT}$, which indicates the EML chip temperature, feeds the control electronics to tune the TEC current $I_{TEC}$, until the EML chip temperature reaches the target temperature. Therefore, the target temperature helps define the wavelength precisely. Termination resistor 530c is bonded in the EA section for impedance matching purpose during high-speed modulation.

Figure 4C:
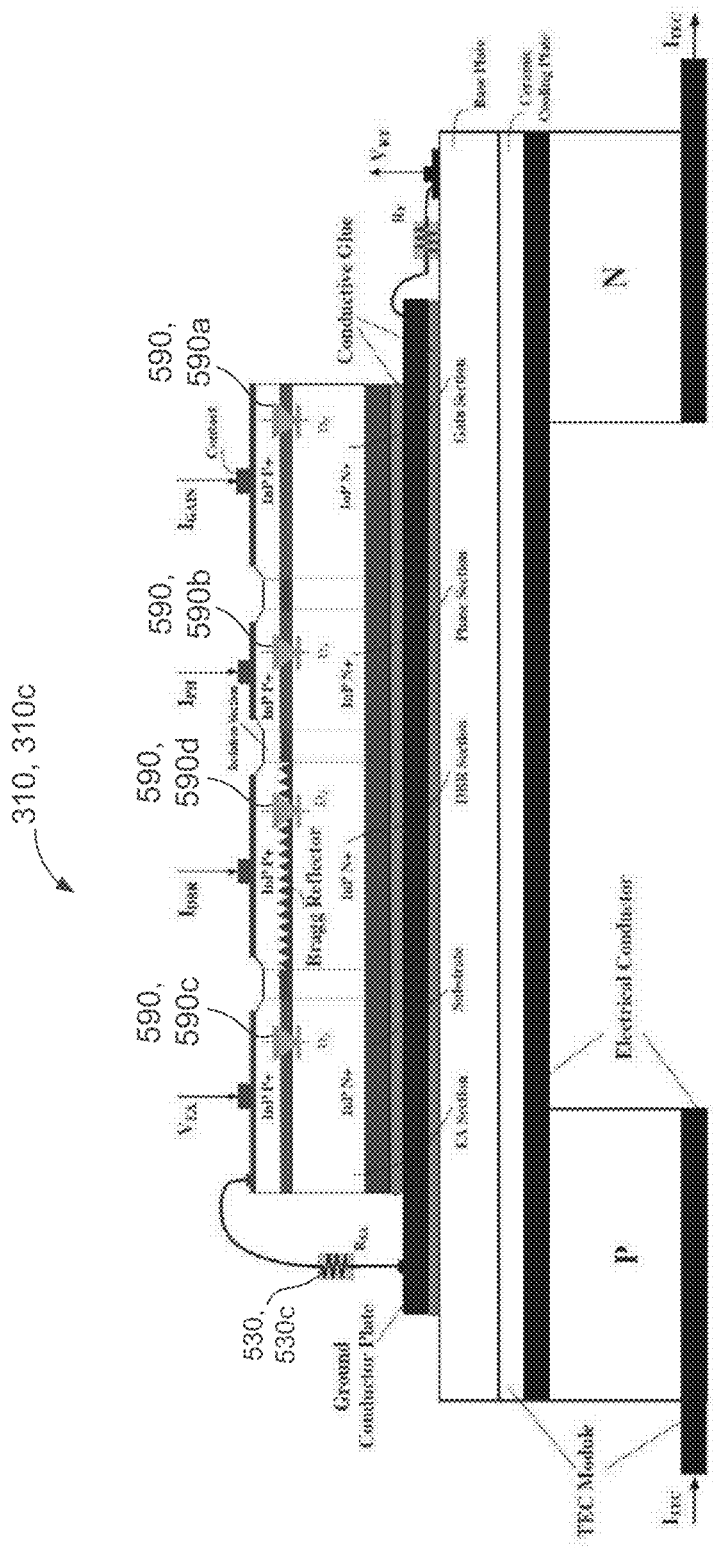

A Distributed Bragg Reflector (DBR) tuning mechanism, in some implementations, tunes the wavelength in addition to the TEC. This allows for further extending of tuning range. As shown in FIG. 4C, an example EML 310c has an additional DBR section. The wavelength is tuned by the refractive index change of the injection current $I_{DBR}$. The TEC may then further fine-tune the wavelength.

The gain sections of the lasers 310 generate a suitable optical power for achieving the transmission distance of the optical signal 104u to the OLT 120. The driving circuit 500 provides these functions through implementation of the biasing current and the modulation current, denoted as $I_{GAIN}$ and $I_{MOD}$ in the example shown. The biasing current generates output power and the modulation current adds the information to the carrier wavelength.

Figure 5A:
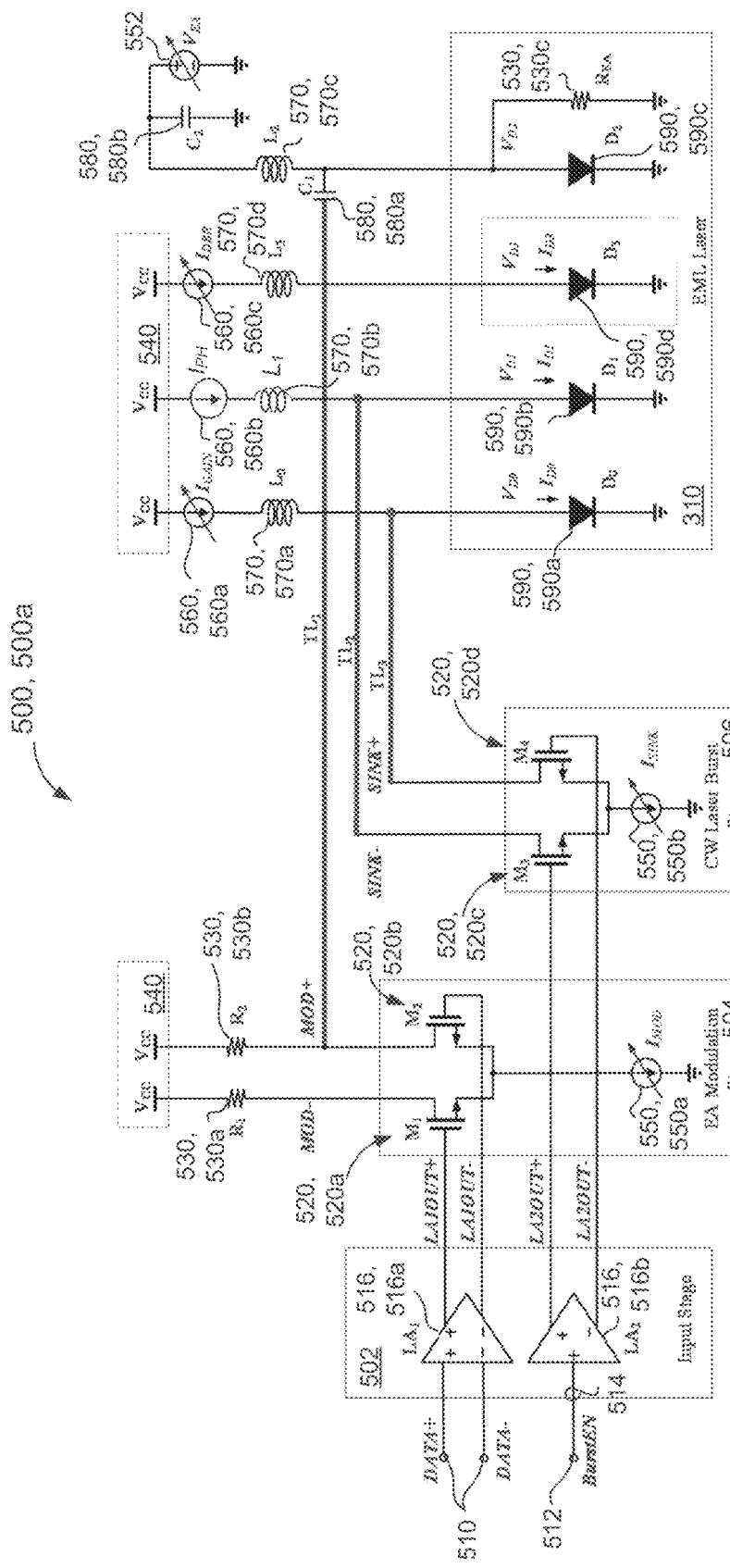
FIG. 5A-5B are schematic views of example Electro-absorption Modulated Laser (EML) driving circuits for use in a tunable optical network unit (ONU).
Figure 5B:
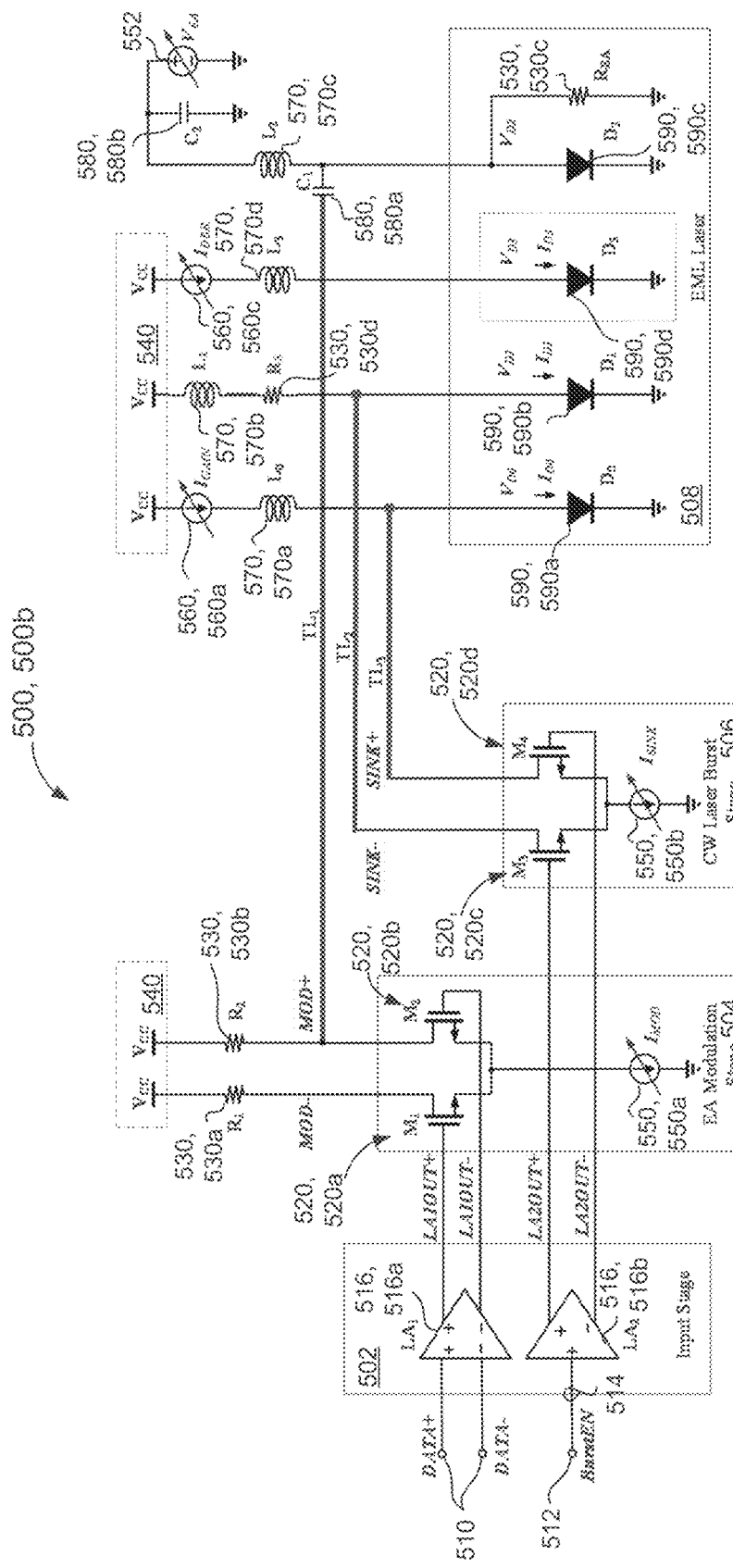

In the example shown of FIG. 4C, each section has P doping anodes (InP P+) with N doping (InP N+) shared-substrate as the cathode, which is normally grounded during the application. The diodes (590a-d) for the DBR tunable laser 310 all share the same cathode for circuit behaviors. While low-speed programmable digital to analog converters (DACs) can provide $I_{DBR}$ and $I_{PHASE}$, the laser driving circuits 500, 500a-b of FIGS. 5A and 5B provide $I_{GAIN}$ through an EML topology with the capability to provide both the biasing current and the high-speed modulation current. The TWDM-PON requires the laser 310 to have stable wavelength and fast ON_OFF times during burst operations. Typically, the phase sections of an EML (see FIGS. 4A-4C) fine-tunes the wavelength through manipulation of $I_{PH}$ and otherwise grounded if not used. However, as described in more detail below, the phase section also compensates for temperature variations during burst operations to reduce wavelength drift and increase burst operations. Reducing the wavelength drift and speeding up burst operations with an improved laser driving circuit design, rather than optical technology improvement, provides reduced costs.

FIGS. 5A and 5B provide schematic views of two example EML driving circuits 500a (FIG. 5A) and 500b (FIG. 5B) for use in a tunable ONU 140. The circuits 500a-b are configured to deliver the gain-section diode current $I_{D0}$ to the anode of the gain-section diode 590a and the phase-section diode current $I_{D1}$ to the anode of the phase-section diode 590b disposed on the shared substrate of the multi-section tunable laser 310. A cathode-side of the gain-section diode 590a and phase-section diode 590b are grounded. The anode-side of the gain-section diode 590a is connected to a voltage source $V_{CC}$ 540 through inductor 570, 570a that delivers the bias current $I_{GAIN}$ to the anode of the gain-section diode $D_0$ 590a. The anode-side of the phase-section diode 590b is connected to the voltage source $V_{CC}$ 540 through inductor 570b that delivers the bias current $I_{PH}$ to the anode of the phase-section diode 590b. Current sources 500, 560a-b deliver and may vary the bias currents to the diodes 590a-b. Here, the magnitude of the $I_{GAIN}$ delivered to the diode 590a determines the optical power of the laser 310 for transmitting optical signals 104u at the at the transmit wavelength $\lambda_{Tx}$ within the wavelength pass-band 204 in the burst-on state. An input stage 502 of circuits 500a-b include a pair of amplifiers, for example, limiting amplifiers (LA) 516, 516a-b, transistors, such as metal-oxide-semiconductor field-effect transistors (MOSFETs) 520, 520a-d, inductors 570, 570a-c, capacitors 580, 580a-b, resistors 530, 5304a-c, and diodes 590, 590a-d. The diodes 590b-d may be driven by DACs. In some implementations, the circuits 500a-b use Bipolar Junction Transistors (BJTs) instead of the MOSFETs 520 to perform switching operations.

The first limiting amplifier 516a receives input data signals DATA+, DATA− providing data information from a data signal source 510 and amplifies the input data signals DATA+, DATA−. In the example shown, the LA 516a corresponds to a differential-in differential-out limiting amplifier for amplifying the differential input data signals DATA+, DATA− from the data signal source 510. The amplified DATA+, DATA− signals are used to switch transistor 520a and transistor 520b in the EA modulation stage 504. The inputs of the amplifiers 516a-b may include terminating resistors to avoid signal reflection.

The EA modulation stage 504 adds an electrical modulation signal to the EA-section diode 590c. The stage 504 includes differential pair 520a and 520b, tail-current source $I_{MOD}$ 550, 550a, and resistors 530a-b. The tail-current source 550a is programmable and may be implemented by a current DAC to control a modulation magnitude. The EA-section diode 590c, in the EML Laser stage 508 is reversely-biased by a programmable voltage source 552. To avoid affecting the normal operating point with the reverse-biasing voltage, an AC capacitor 580a couples the modulation to the EA-section diode 590c anode. Resistor 530b, optimally located near voltage supply 540, is matched (e.g., has the same value) with resistor 530c to increase speed and signal integrity. The connection to the far-end capacitor 580a functions as a high-speed transmission line (TL1) with characteristic impedance equal to 530c. Inductor 570c shields diode 590c from the negative voltage source 552 effects during high-speed modulation. Capacitor 580b filters low-frequency ripples from the programmable voltage source 552.

The second limiting amplifier 516b receives input signal BurstEN 514 from burst mode signal source 512 and amplifies BurstEN 514. BurstEN 514 indicates, to the laser circuit 500a-b, one of a burst ON or a burst OFF state. For example, a logic high or '1' may indicate a burst ON state while a logic low or '0' may indicate a burst OFF state. The amplified differential output of LA 516b switches transistors 520c-d in a CW Laser burst stage 506. The CW laser burst stage 506 is interchangeably referred to as a sinking stage 506. The CW Laser burst stage 506 also includes programmable sink tail-current source 550b ($I_{SINK}$). The current source 550b is configured to adjust the sink current that is diverted from $I_{GAIN}$ and $I_{PH}$. Still referring to FIGS. 5A and 5B, programmable current sources $I_{GAIN}$ and $I_{PH}$ bias diodes 590a-b respectively. The differential pair 520c-d connects to the anodes of the gain-section diode 590a and the phase-section diode 590b. For instance, transistor 520c connects to the anode of the phase-section diode 590b and transistor 520d connects to the anode of the gain-section diode 590a. The connections between the transistors 520c-d and the diodes 590a-b may function as high-speed transmission lines to increase signal integrity. At burst ON state (BurstEN 514 is asserted), LA2OUT+, which is an amplified BurstEn signal 514, switches on transistor 520c, while LA2OUT−, which is the complementary signal of LA2OUT+, switches transistor 520d off. In this scenario, generally all of the current $I_{SINK}$ passes through transistor 520c from $I_{PH}$. Therefore, the CW laser diode 590a is biased by the $I_{GAIN}$ alone, and $I_{GAIN}$ defines the optical power accordingly. The current across diode 590b is $I_{PH}-I_{SINK}$.

When the burst mode transitions to the burst OFF state (BurstEN 514 is not asserted), LA2OUT+ switches off the transistor 520c, LA2OUT− turns on the transistor 520d. In this state, generally all of the current $I_{SINK}$ passes through transistor 520d from $I_{GAIN}$. Therefore, the current across the CW laser diode 590a is $I_{GAIN}-I_{SINK}$ and the current across phase-section diode 590b is $I_{PH}$. When $I_{GAIN}$ and $I_{PH}$ are larger than $I_{SINK}$, the circuit operates within normal ranges and the total current is constantly $I_{GAIN}+I_{PH}-I_{SINK}$, regardless of the state of BurstEN 514. Therefore, driving circuits 500a-b remove the current variations caused by self-heating effects during bursts and reduce wavelength drift. Optionally, a current DAC implements current $I_{PH}$. Programmable $I_{PH}$ 560b according to the specific laser structure may further minimize wavelength drift. In some implementations, as shown in FIG. 5B, programmable current $I_{PH}$ 560b is replaced by resistor 530d. Careful selection of resistor 530d minimizes the wavelength drift while simultaneously reducing costs.

Figure 6:
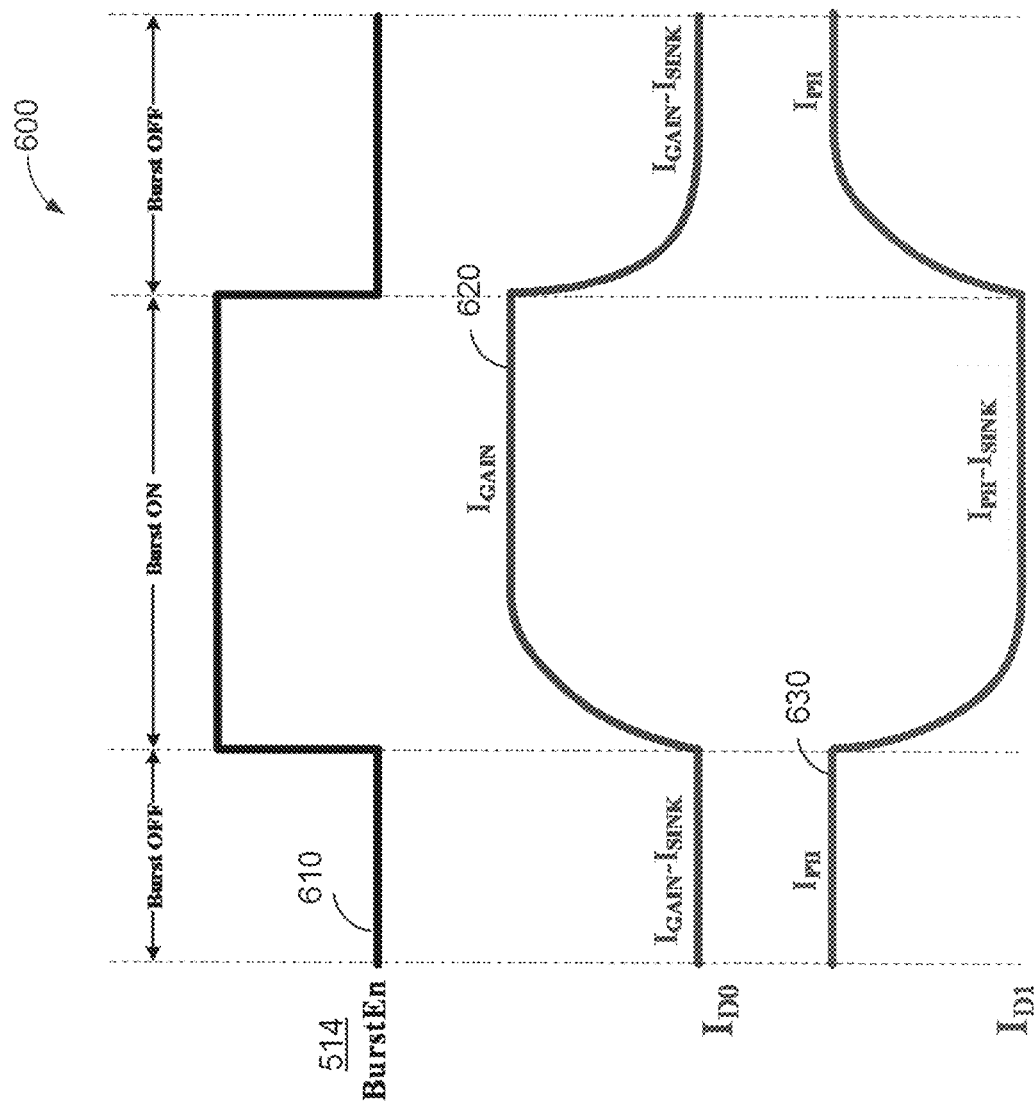
FIG. 6 illustrates a plot depicting burst-on state and burst-off state times based on bias currents applied by the laser driving circuits of FIG. 5A or 5B.

FIG. 6 illustrates plot 600 of the gain-section diode 590a and phase-section diode 590b currents ($I_{D0}$ and $I_{D1}$) for both the burst ON and burst OFF states. Profile line 610 depicts the state of BurstEN 514. Profile line 620 depicts current $I_{D0}$, while profile line 630 depicts current $I_{D1}$. When in the burst OFF state (BurstEn='0'), $I_{D0}$ is equal to $I_{GAIN}-I_{SINK}$ and $I_{D1}$ is equal to $I_{PH}$. When in the burst ON state (BurstEN='1'), $I_{D0}$ is equal to $I_{GAIN}$ and $I_{D1}$ is equal to $I_{PH}-I_{SINK}$.

In traditional driving circuits, during the burst OFF state, $I_{GAIN}$ is completely switched away from the diode 590a, so that $I_{D0}$, as well as $V_{D0}$, is at or near 0. Then, the output optical power is negligible. However, fully disabling the laser 310 creates a long burst ON time as the gain-section diode 590a anode must re-stabilize from 0V to the voltage above the threshold, which is normally greater than 1V. Similarly, this also creates a long burst OFF time. Moreover, fully disabling the laser 310 introduces additional wavelength drift because of the large ON-OFF laser current difference. Instead of completely diverting current from the laser 310 at burst OFF state, the laser circuit 500a-b may program $I_{SINK}$ such that the laser current $I_{D0}$ is slightly below a threshold required to operate the laser 310 at an optical power required for transmission. While such an optical power is effective for a burst OFF state, the laser 310 can quickly return to the burst ON state, allowing for faster modulation than if the circuit 500a-b fully diverts the current away from the laser 310.

Figure 7:
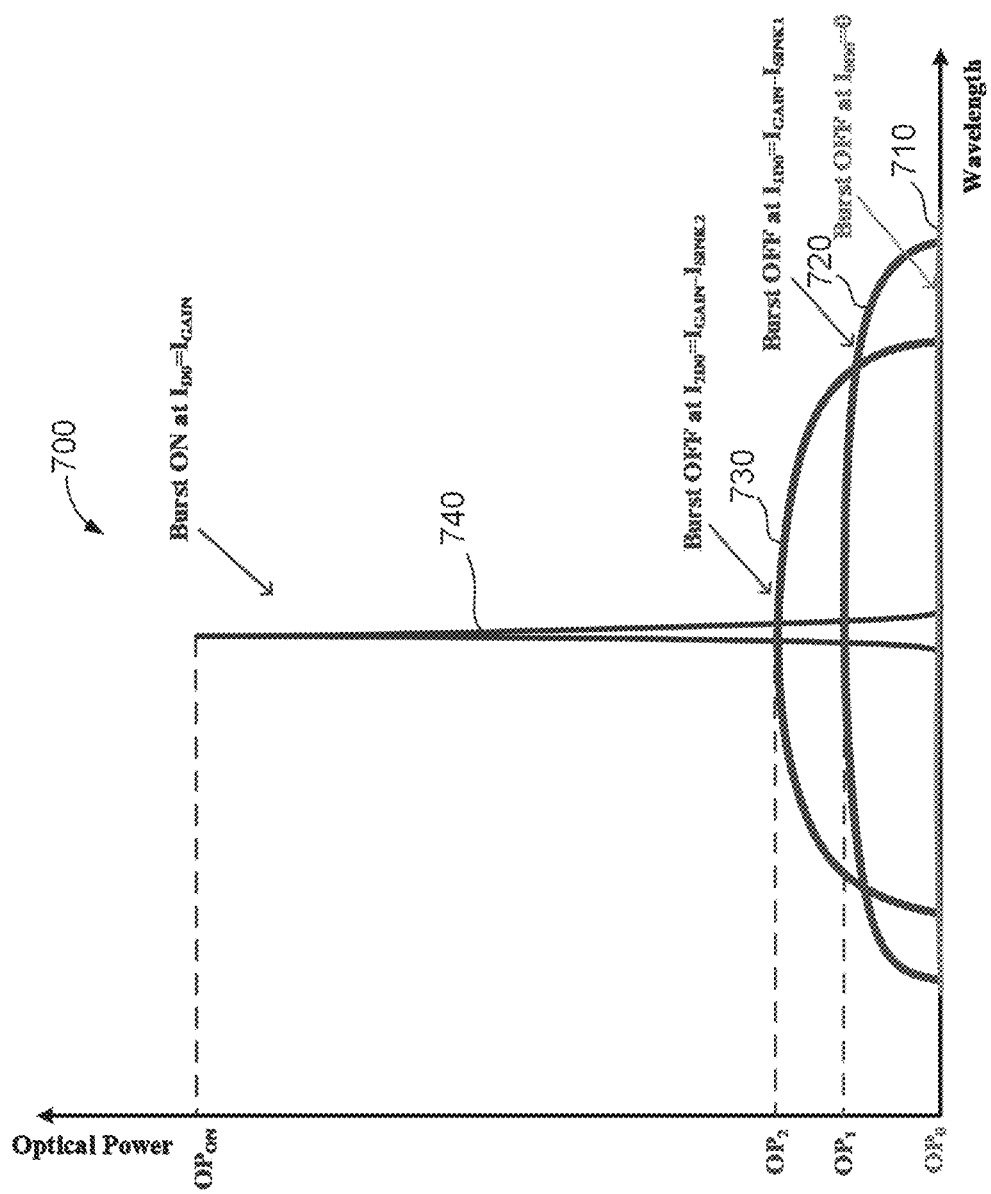
FIG. 7 illustrates a plot depicting burst-on state and burst-off state bias currents based on optical power applied by the laser driving circuits of FIG. 5A or 5B.
Figure 8:
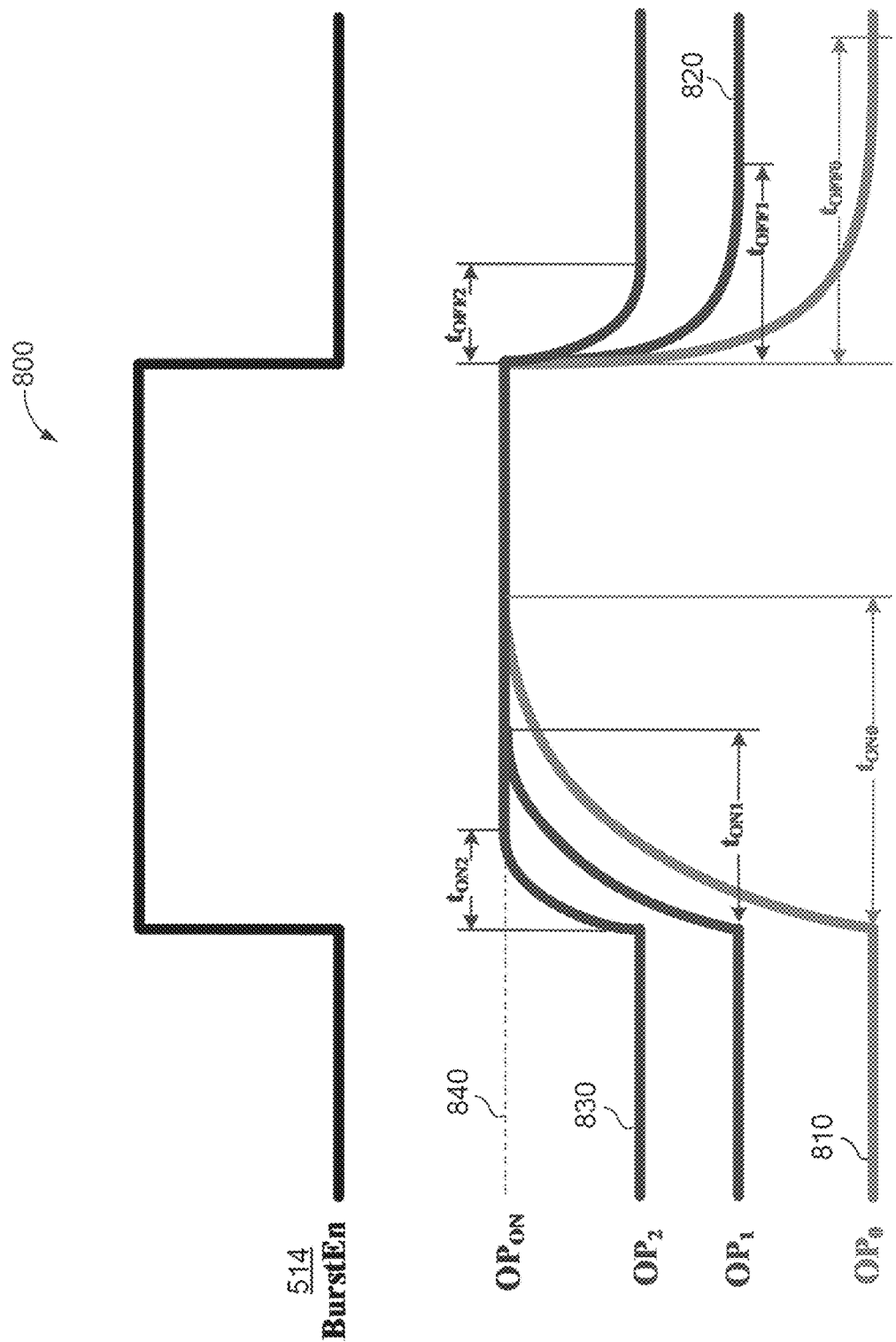
FIG. 8 illustrates a plot depicting burst-on state and burst-off state times based on optical power of a laser for different magnitudes of sink current applied by the laser driving circuits of FIG. 5A or 5B.

Referring now to FIG. 7, profile line 710 of plot 700 depicts the optical power and wavelength of the laser 310 during the burst OFF state when the diode current is fully diverted away ($I_{D0}$=0 and $I_{GAIN}=I_{SINK}$). The optical power is at state $OP_0$. Profile line 720 depicts the optical power and wavelength of the laser 310 when $I_{SINK}$ is less than $I_{GAIN}$ and $I_{D0}=I_{GAIN}-I_{SINK}$. In this configuration, the optical power is at state $OP_1$, which is greater than $OP_0$, but still well below the threshold optical power necessary to enable the laser 310, $OP_{ON}$. Profile line 730 depicts the optical power and wavelength of the laser 310 when $I_{SINK}$ is again less than $I_{GAIN}$ and $I_{D0}=I_{GAIN}-I_{SINK}$. In this configuration, the optical power is at state $OP_2$, which is greater than $OP_0$ and $OP_1$, but still below the threshold optical power necessary to enable the laser 310, $OP_{ON}$. Profile line 740 depicts the optical power and wavelength of the laser 310 during the burst ON state and when $I_D=I_{GAIN}$ ($I_{SINK}$=0). At optical power states $OP_1$ and $OP_2$, the laser 310 works at spontaneous emission states well below the lasing power $OP_{ON}$. The sub-threshold currents in the laser 310 allow much faster burst ON and OFF time as the laser anode stabilizing points are near to a threshold voltage. Referring now to FIG. 8, the EML burst time with optical power stales $OP_0$, $OP_1$, $OP_2$, and $OP_{ON}$ are illustrated by plot 800 with profile lines 810, 820, 830, and 840, respectively. As shown, as the optical power state increases, the burst ON and OFF time decrease.

Figure 9:
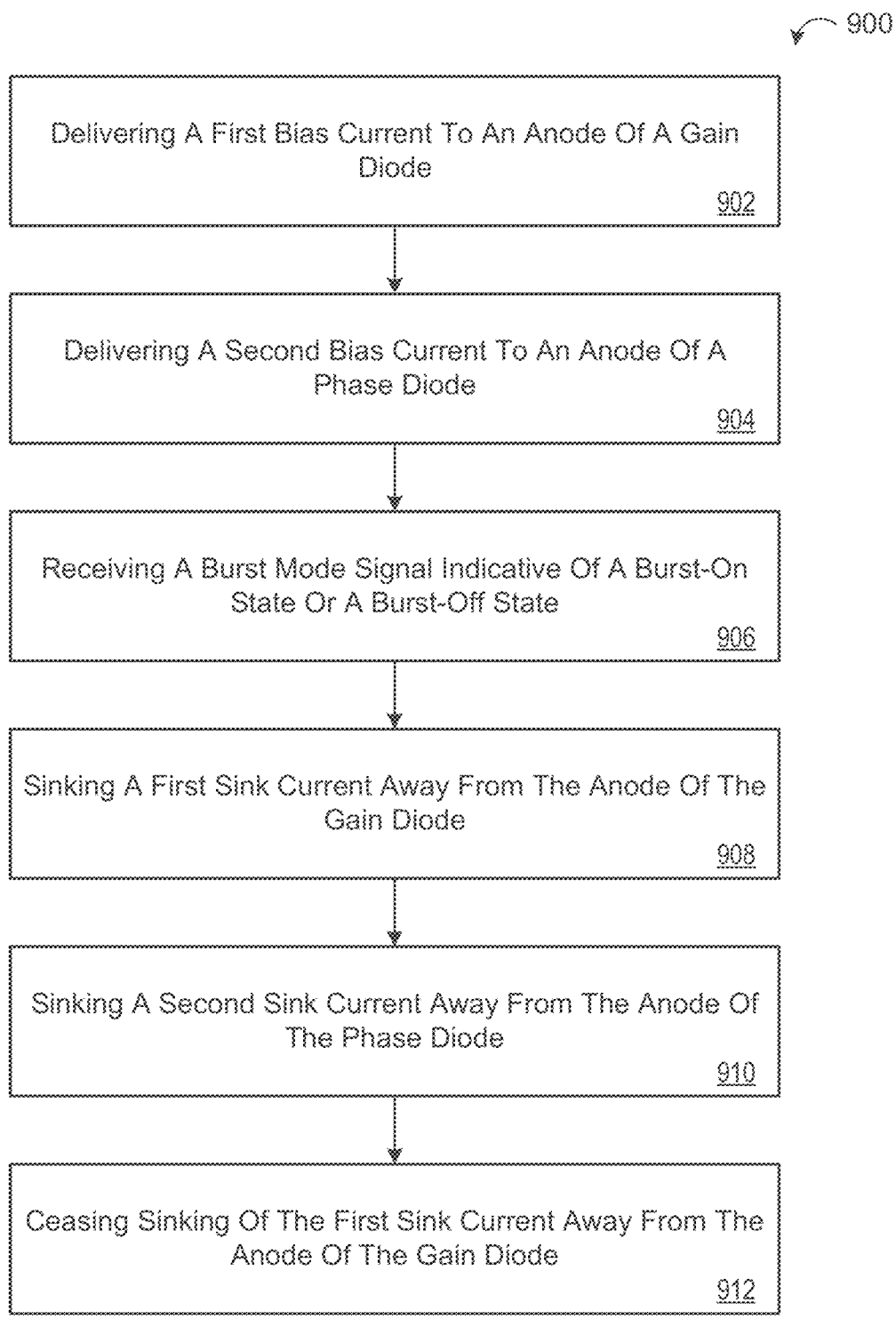
FIG. 9 is a schematic view of an example arrangement of operations for a method of biasing a tunable laser during burst-on and burst-off stales through an EML driving circuit.

FIG. 9 is a flowchart of an example method 900 for biasing a tunable laser 310 during burst-on and burst-off states through an EML driving circuit 500. For example, the tunable laser 310 may be an electro-absorption modulated tunable laser. The flowchart starts at operation 902 when the laser driving circuit 500a-b delivers a first bias current to an anode of a gain-section diode 590a. At operation 904, the method 900 includes delivering a second bias current to an anode of a phase-section diode 590b. As shown in FIG. 5A, the anode of the phase-section diode 590b may connect to a current source 560b through an inductor 570b. Alternatively, as shown in FIG. 5B, the anode of the phase-section diode 590b connects to an inductor 570b through a resistor 530d. The inductor 570b may connect to a voltage source 540.

At operation 906, the method 900 includes receiving, at the laser driving circuit 500, a burst mode signal 514 indicative of a burst-on state or a burst-off state. At operation 908, when the burst mode signal 514 is indicative of the burst-off state, the method 900 includes sinking, by the laser driving circuit 500, a first sink current away from the anode of the gain-section diode 590a. The first sink current is less than the first bias current. The gain-section diode 590a may receive a gain-section diode current equal to the first bias current minus the first sink current.

At operation 910, when the burst mode signal 514 is indicative of the burst-on state, the method 900 includes sinking, by the laser driving circuit 500, a second sink current away from the anode of the phase-section diode 590b. The second sink current is less than the second bias current. The phase-section diode 590b may receive a phase-section diode current equal to the second bias current minus the second sink current. At operation 912, while the burst mode signal 514 is still indicative of the burst-off state, the method 900 includes ceasing, by the laser driving circuit 500, sinking of the first sink current away from the anode of the gain-section diode 590a.

In some implementations, the method 900 includes receiving, at the laser driving circuit 500, a sink current adjustment from a CW laser burst stage or sinking stage 506 of the laser driving circuit 500, where the sink current adjustment is configured to adjust the first sink current and the second sink current. The CW laser burst stage 506 may include a differential pair of first and second MOSFETs 520c-520d. Each MOSFET 520c-520d connects to a burst mode signal source 512, with the first MOSFET 520c connected to the anode of the phase-section diode 590b and the second MOSFET 520d connected to the anode of the gain-section diode 590a. The first MOSFET 520c may be turned off and the second MOSFET 520d may be turned on to sink the first sink current away from the anode of the gain-section diode 590a when the burst mode signal 514 is indicative of the burst-off state. Similarly, the first MOSFET 520c turns on and the second MOSFET 520d turns off to sink the second sink current away from the anode of the phase-section diode 520b when the burst mode signal 514 is indicative of the burst-on state.

In some examples, the method 900 includes modulating, by the laser driving circuit 500, the laser 310 by a capacitively coupled modulation stage 504 of the laser driving circuit 500a-b to the anode of a modulation-section diode 530c, resulting in an alternating current (AC) modulation current. The modulation stage 504 may include a differential pair of first and second MOSFETs 520a-b, each MOSFET 520a-b connected to a positive data signal source and a negative data signal source 510. The first MOSFET 520a connects to a first resistor 530a and the first resistor 530a connects to a voltage source 540. The second MOSFET 520b is connected to a second resistor 530b and to a capacitor 580a, the second resistor 530b connected to the voltage source 540, and the capacitor 580a connected to the anode of the modulation-section diode 530c. The capacitor 580a may connect to a variable voltage source 552.

Figure 10:
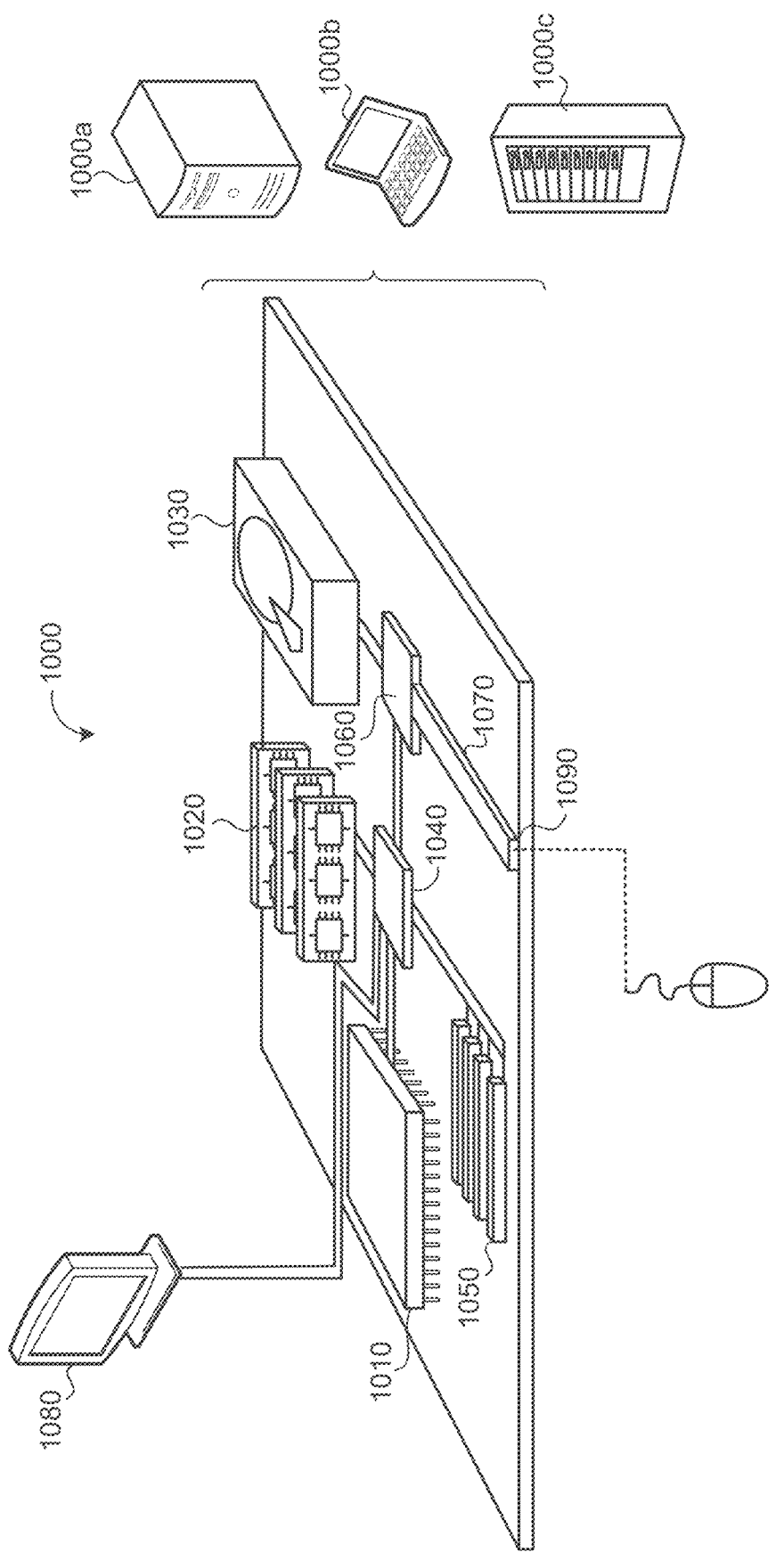
FIG. 10 is a schematic view of an example computing device that may be used to implement the systems and methods described in this document.

FIG. 10 is schematic view of an example computing device 1000 that may be used to implement the systems and methods described in this document. The computing device 1000 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 1000 includes a processor 1010, memory 1020, a storage device 1030, a high-speed interface/controller 1040 connecting to the memory 1020 and high-speed expansion ports 1050, and a low speed interface/controller 1060 connecting to a low speed bus 1070 and a storage device 1030. Each of the components 1010, 1020, 1030, 1040, 1050, and 1060, are interconnected using various busses, and may be mounted on a common motherboard or in other manners as appropriate. The processor 1010 can process instructions for execution within the computing device 1000, including instructions stored in the memory 1020 or on the storage device 1030 to display graphical information for a graphical user interface (GUI) on an external input/output device, such as display 1080 coupled to high speed interface 1040. In other implementations, multiple processors and/or multiple buses may be used, as appropriate, along with multiple memories and types of memory. Also, multiple computing devices 1000 may be connected, with each device providing portions of the necessary operations (e.g., as a server bank, a group of blade servers, or a multi-processor system).

The memory 1020 stores information non-transitorily within the computing device 1000. The memory 1020 may be a computer-readable medium, a volatile memory unit(s), or non-volatile memory unit(s). The non-transitory memory 1020 may be physical devices used to store programs (e.g., sequences of instructions) or data (e.g., program state information) on a temporary or permanent basis for use by the computing device 1000. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 1030 is capable of providing mass storage for the computing device 1000. In some implementations, the storage device 1030 is a computer-readable medium. In various different implementations, the storage device 1030 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 1020, the storage device 1030, or memory on processor 1010.

The high speed controller 1040 manages bandwidth-intensive operations for the computing device 1000, while the low speed controller 1060 manages lower bandwidth-intensive operations. Such allocation of duties is exemplary only. In some implementations, the high-speed controller 1040 is coupled to the memory 1020, the display 1080 (e.g., through a graphics processor or accelerator), and to the high-speed expansion ports 1050, which may accept various expansion cards (not shown). In some implementations, the low-speed controller 1060 is coupled to the storage device 1030 and a low-speed expansion port 1090. The low-speed expansion port 1090, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 1000 may be implemented in a number of different forms, as shown in the figure. For example, it may be implemented as a standard server 1000a or multiple times in a group of such servers 1000a, as a laptop computer 1000b, or as part of a rack server system 1000c.

A software application (i.e., a software resource) may refer to computer software that causes a computing device to perform a task. In some examples, a software application may be referred to as art "application," an "app," or a "program." Example applications include, but are not limited to, system diagnostic applications, system management applications, system maintenance applications, word processing applications, spreadsheet applications, messaging applications, media streaming applications, social networking applications, and gaming applications.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks, and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
    delivering, by a laser driving circuit, a first bias current to an anode of a gain-section diode disposed on a shared substrate of a tunable laser;
    delivering, by the laser driving circuit, a second bias current to an anode of a phase-section diode disposed on the shared substrate of the tunable laser;
    receiving, at the laser driving circuit, a burst mode signal indicative of a burst-on state or a burst-off state;
    when the burst mode signal is indicative of the burst-off state, sinking, by the laser driving circuit, a first sink current away from the first bias current at the anode of the gain-section diode, the first sink current less than the first bias current delivered to the anode of the gain-section diode; and when the burst mode signal transitions to be indicative of the burst-on state from the burst-off state:

sinking, by the laser driving circuit, a second sink current away from the second bias current at the anode of the phase-section diode, the second sink current less than the second bias current delivered to the anode of the phase-section diode; and ceasing, by the laser driving circuit, the sinking of the first sink current away from the first bias current at the anode of the gain-section diode, wherein the anode of the phase-section diode is connected to one of:

a current source through a first inductor; or a second inductor through a resistor, the second inductor connected to a voltage source.

2. The method of claim 1, wherein:

when the burst mode signal is indicative of the burst-off state, the gain-section diode receives a gain-section diode current equal to the first bias current minus the first sink current; and when the burst mode signal is indicative of the burst-on state, the phase-section diode receives a phase-section diode current equal to the second bias current minus the second sink current.

3. The method of claim 1, further comprising receiving, at the laser driving circuit, a sink current adjustment from a sinking stage of the laser driving circuit, the sink current adjustment configured to adjust the first sink current and the second sink current.

4. The method of claim 3, wherein the sinking stage comprises a differential pair of first and second metal oxide silicon field effect transistors (MOSFETs), each MOSFET connected to a burst mode signal source, the first MOSFET connected to the anode of the phase-section diode, the second MOSFET connected to the anode of the gain-section diode.

5. The method of claim 4, wherein the first MOSFET is turned off and the second MOSFET is turned on to sink the first sink current away from the anode of the gain- section diode- when the burst mode signal is indicative of the burst-off state.

6. The method of claim 4, wherein the first MOSFET is turned on and the second MOSFET is turned off to sink the second sink current away from the anode of the phase-section diode when the burst mode signal is indicative of the burst-on state.

7. The method of claim 1, wherein the anode of the phase-section diode is connected to the second current source through the first inductor.

8. The method of claim 1, wherein the anode of the phase-section diode is connected to the second inductor through the resistor.

9. The method of claim 1, further comprising, modulating, by the laser driving circuit, the laser by a capacitively coupled modulation stage of the laser driving circuit to an anode of an Electro-Absorption-section diode, resulting in an alternating current modulation current.

10. The method of claim 9, wherein the capacitively coupled modulation stage comprises a differential pair of first and second MOSFETs, each MOSFET connected to a positive data signal source and a negative data signal source, the first MOSFET connected to a first resistor, the first resistor connected to a voltage source, the second MOSFET connected to a second resistor and to a capacitor, the second resistor connected to the voltage source, and the capacitor connected to the anode of the Electro-Absorption-section diode.

11. The method of claim 10, wherein the capacitor is connected to an inductor connected to a variable voltage source.

12. The method of claim 1, wherein the tunable laser comprises an electro-absorption modulated tunable laser.

13. A laser driving circuit comprising:

a first current source configured to deliver a first bias current to an anode of a gain-section diode- disposed on a shared substrate of a tunable laser;

a second current source configured to deliver a second bias current to an anode of a phase-section diode disposed on the shared substrate of the tunable laser; and a sinking stage configured to receive a burst mode signal indicative of a burst-on state or a burst-off state, the sinking stage configured to:

when the burst mode signal is indicative of the burst-off state, sink a first sink current away from the first bias current at the anode of the gain-section diode, the first sink current less than the first bias current received by the anode of the gain-section diode; and when the burst mode signal transitions to be indicative of the burst-on state from the burst-off state:

sink a second sink current away from the second bias current at the anode of the phase-section diode, the second sink current less than the second bias current received by the anode of the phase-section diode; and cease the sinking of the first sink current away from the first bias current at the anode of the gain-section diode, wherein the anode of the phase-section diode is connected to the second current source comprised by one of:

a current source element and a first inductor; or a second inductor and a resistor, the second inductor connected to a voltage source.

14. The laser driving circuit of claim 13, wherein:

when the burst mode signal is indicative of the burst-off state, the gain-section diode receives a gain-section diode current equal to the first bias current minus the first sink current; and when the burst mode signal is indicative of the burst-on state, the phase-section diode receives a phase-section diode current equal to the second bias current minus the second sink current.

15. The laser driving circuit of claim 13, further comprising a third current source configured to adjust the first sink current and the second sink current.

16. The laser driving circuit of claim 13, wherein the sinking stage comprises a differential pair of first and second metal oxide silicon field effect transistors (MOSFETs), each MOSFET connected to a burst mode signal source, the first MOSFET connected to the anode of the phase-section diode, the second MOSFET connected to the anode of the gain-section diode.

17. The laser driving circuit of claim 16, wherein the first MOSFET is turned off and the second MOSFET is turned on to sink the first sink current away from the anode of the gain-section diode when the burst mode signal is indicative of the burst-off state.

18. The laser driving circuit of claim 16, wherein the first MOSFET is turned on and the second MOSFET is turned off to sink the second sink current away from the anode of the phase-section diode when the burst mode signal is indicative of the burst-on state.

19. The laser driving circuit of claim 13, wherein the anode of the phase-section diode is connected to the current source element through the first inductor.

20. The laser driving circuit of claim 13, wherein the anode of the phase-section diode is connected to the second inductor through the resistor.

21. The laser driving circuit of claim 13, further comprising a modulation stage capacitively coupled to an anode of an Electro-Absorption-section diode, resulting in an alternating current modulation current.

22. The laser driving circuit of claim 21, wherein the modulation stage comprises a differential pair of first and second MOSFETs, each MOSFET connected to a positive data signal source and a negative data signal source, the first MOSFET connected to a first resistor, the first resistor connected to a voltage source, the second MOSFET connected to a second resistor and to a capacitor, the second resistor connected to the voltage source, and the capacitor connected to the anode of the Electro-Absorption-section diode.

23. The laser driving circuit of claim 22, wherein the capacitor is connected to an inductor connected to a variable voltage source.

24. The laser driving circuit of claim 13, wherein the tunable laser comprises an Electro-absorption Modulated tunable laser.

* * * * *